(12) United States Patent
Noda

(10) Patent No.: US 8,009,505 B2
(45) Date of Patent: Aug. 30, 2011

(54) SEMICONDUCTOR MEMORY DEVICE

(75) Inventor: Hiromasa Noda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 137 days.

(21) Appl. No.: 12/500,023

(22) Filed: Jul. 9, 2009

(65) Prior Publication Data

US 2009/0268542 A1   Oct. 29, 2009

Related U.S. Application Data

(62) Division of application No. 11/822,598, filed on Jul. 9, 2007, now Pat. No. 7,586,807.

(30) Foreign Application Priority Data

Jul. 24, 2006   (JP) ................................ 2006-200983

(51) Int. Cl.
*G11C 8/00* (2006.01)

(52) U.S. Cl. ....... 365/230.06; 365/189.08; 365/189.011; 365/230.01

(58) Field of Classification Search ............. 365/230.06, 365/189.08, 189.011, 230.01
See application file for complete search history.

(56) References Cited

U.S. PATENT DOCUMENTS

| | | | |
|---|---|---|---|
| 5,812,490 A | 9/1998 | Tsukude | |
| 5,995,404 A * | 11/1999 | Nakaumura et al. ............ | 365/63 |
| 6,088,290 A | 7/2000 | Ohtake et al. | |
| 6,256,252 B1 | 7/2001 | Arimoto | |
| 6,333,879 B1 | 12/2001 | Kato et al. | |
| 6,629,224 B1 | 9/2003 | Suzuki et al. | |
| 6,650,594 B1 * | 11/2003 | Lee et al. .................. | 365/233.15 |
| 6,697,296 B2 * | 2/2004 | Matsumoto et al. ...... | 365/189.16 |
| 6,721,223 B2 * | 4/2004 | Matsumoto et al. .......... | 365/222 |
| 6,791,892 B2 * | 9/2004 | Bae et al. ....................... | 365/222 |
| 6,798,701 B2 | 9/2004 | Yamazaki | |
| 6,845,055 B1 | 1/2005 | Koga et al. | |
| 6,862,247 B2 * | 3/2005 | Yamazaki ................ | 365/230.03 |
| 6,879,540 B2 * | 4/2005 | Maruyama et al. ...... | 365/189.03 |
| 6,930,948 B2 | 8/2005 | Lee et al. | |
| 7,120,085 B2 * | 10/2006 | Lee ............................ | 365/233.1 |
| 7,142,467 B2 * | 11/2006 | Chun ........................... | 365/193 |
| 7,184,358 B2 * | 2/2007 | Kobayashi et al. ...... | 365/230.06 |
| 7,206,245 B2 | 4/2007 | Seitz et al. | |
| 7,292,953 B2 | 11/2007 | Jung | |
| 7,586,807 B2 * | 9/2009 | Noda ............................ | 365/227 |
| 2007/0126469 A1 | 6/2007 | Kim et al. | |

FOREIGN PATENT DOCUMENTS

| | | |
|---|---|---|
| JP | 2000-13215 | 1/2000 |
| JP | 2000-48568 | 2/2000 |
| JP | 2005-322379 | 11/2005 |
| JP | 2007-097137 | 4/2007 |

* cited by examiner

*Primary Examiner* — Viet Q Nguyen
(74) *Attorney, Agent, or Firm* — Young & Thompson

(57) ABSTRACT

A semiconductor memory device includes a row control circuit block and a column control circuit block each performing an access control over a memory cell array, a data I/O circuit block transmitting and receiving data to and from the memory cell array, and a control circuit changing at least a part of the row control circuit block, the column control circuit block, and the data I/O circuit block from a standby state into an active state in response to a setting of a predetermined mode signal to a mode register. According to the present invention, even if it is necessary to turn predetermined circuit blocks into the active state by an operation other than a read or write operation, there is no need to always set these circuit blocks into the active state.

8 Claims, 7 Drawing Sheets

US 8,009,505 B2

SEMICONDUCTOR MEMORY DEVICE

TECHNICAL FIELD

The present invention relates to a semiconductor memory device, and particularly relates to a semiconductor memory device the power consumption of which can be reduced in a standby state.

BACKGROUND OF THE INVENTION

In recent years, an operating voltage of a semiconductor memory device as typified by a DRAM (Dynamic Random Access Memory) has been gradually decreasing so as to reduce power consumption of the semiconductor memory device. Currently, some semiconductor memory devices use quite low operating voltages of about 1 volt. If the operating voltage decreases, it is necessary to reduce a threshold voltage of each transistor accordingly. As a result, a sub-threshold current flowing through the transistor in an off state disadvantageously increases. To solve such a problem, a method of dividing power supply wirings into a main power supply wiring and a pseudo power supply wiring have been proposed in Japanese Patent Application Laid open Nos. 2000-13215 and 2000-48568.

FIG. 6 is a circuit diagram of a conventional semiconductor memory device using pseudo power supply wirings.

A circuit shown in FIG. 6 includes a circuit block 10 configured to include four stages of inverters 11 to 14. The circuit block 10 is a block the logic of which is fixed in a standby state. In the example shown in FIG. 6, a signal IN input to the circuit block 10 is fixed to high level in the standby state. Needless to say, a logic value of the input signal IN is appropriately changed into an active state.

Four power supply wirings, that is, a main power supply wiring VDD and a pseudo power supply wiring VDT to each of which a power supply potential is supplied, and a main power supply wiring VSS and a pseudo power supply wiring VST to each of which a ground potential is supplied are provided for the circuit shown in FIG. 6. A P-channel MOS transistor 21 is provided between the main power supply wiring VDD and the pseudo power supply wiring VDT, and a standby signal S0B is supplied to a gate electrode of the P-channel MOS transistor 21. Further, an N-channel MOS transistor 22 is provided between the main power supply wiring VSS and the pseudo power supply wiring VST, and a standby signal S0 is supplied to a gate electrode of the N-channel 1 MOS transistor 22. The standby signal S0B is an inverted signal obtained by causing an inverter 23 to invert the standby signal S0.

The standby signal S0 is a signal that becomes low level when the circuit block 10 is set in the standby state, and kept to be high level when the circuit block 10 is in the active state. Due to this, in the active state, the main power supply wiring VDD is shorted to the pseudo power supply wiring VDT via the transistor 21, and the main power supply wiring VST is shorted to the pseudo power supply wiring VSS via the transistor 22 On the other hand, in the standby state, the transistors 21 and 22 are turned into nonconductive states. Due to this, the pseudo power supply wirings VDT and VSS are disconnected from the power supply wirings VDD and VST, respectively. As a result, the power supply potential is hardly supplied to the circuit block 10.

Moreover, among the four inverters 11 to 14 included in the circuit block 10, the first inverter 11 and the third inverter 13 are connected between the pseudo power supply wiring VDT and the main power supply wiring VSS. Further, the second inverter 12 and the fourth inverter 14 are connected between the main power supply wiring VDD and the pseudo power supply wiring VST. As described above, in the active state, the main power supply wiring VDD is shorted to the pseudo power supply wiring VDT, and the main power supply wiring VSS is shorted to the pseudo power supply wiring VST. Accordingly, a power supply voltage is correctly applied to both power supply terminals of each of all the inverters 11 to 14, whereby the circuit block 10 can operate normally. Therefore, a signal OUT output from the circuit bock 10 has a correct value according to the logic value of the input signal IN.

Meanwhile, in the standby state, the pseudo power supply wiring VDT is disconnected from the main power supply wiring VDD, and the pseudo power supply wiring VST is disconnected from the main power supply wiring VSS. Accordingly, the power supply potential is hardly supplied to sources of P-channel MOS transistors 11p and 13p included in the first inverter 11 and the third inverter 13, respectively. In addition, the power supply potential is hardly supplied to sources of N-channel MOS transistors 12n and 14n included in the second inverter 12 and the fourth inverter 14, respectively.

Nevertheless, because the input signal IN is fixed to the high level in the standby state, transistors that are included in the inverters 11 to 14 and that are turned into on states are fixed to an N-channel MOS transistor 11n, a p-channel MOS transistor 12p, an N-channel MOS transistor 13n, and a P-channel MOS transistor 14p shown in FIG. 6, respectively. Furthermore, sources of these transistors 11n, 12p, 13n, and 14p are connected to the main power supply wiring VDD or VSS, so that the logic of the circuit block 10 is maintained correctly in the standby state.

On the other hand, sources of the P-channel MOS transistors 11p and 13p that are turned into off states in the standby state are connected to the pseudo power supply wiring VDT disconnected from the main power supply wiring VDD. Due to this, sub-threshold current hardly flows through the P-channel MOS transistors 11p and 13p. Likewise, sources of the N-channel MOS transistors 12n and 14n that are turned into off states in the standby state are connected to the pseudo power supply wiring VST disconnected from the main power supply wiring VSS. Due to this, sub-threshold current hardly flows through the N-channel MOS transistors 12n and 14n. It is thereby possible to reduce the power consumption while the circuit block 10 is in the standby state.

In this manner, if the power supply wiring is hierarchized by using not only the main power supply wirings, but also the pseudo power supply wirings, the power consumption can be reduced while the circuit block the logic of which is fixed in the standby state is in the standby state.

If such hierarchical power supply wirings are employed in a semiconductor memory device such as a DRAM, it is preferable to apply the hierarchical power supply wirings to an address control circuit block performing access control over a memory cell array and a data I/O circuit block transmitting and receiving data to and from the memory cell array. In this case, it suffices to change each of the address control circuit block and the data I/O circuit block from the standby state into the active state in response to a command signal, e.g., an activation command, issued at the start of a read or write operation.

However, the conventional technique has the following problems. Recent semiconductor memory devices are increasingly becoming multifunctional. Due to this, even in a period in which no read or write operation is carried out, it is often necessary to change a part of circuit blocks into the active state. For example, in a synchronous DRAM of DDR2 type that supports an ODT (On Die Termination) function and an OCD (Off Chip Driver) function, it is necessary to turn a data I/O circuit block into the active state so as to use the ODT or to adjust an OCD impedance.

Due to this, to allow using the ODT or adjusting the OCD impedance while the command, e.g., the activation command, issued at the start of the read or write operation is not issued, it is necessary to constantly turn the data I/O circuit block into the active state, disadvantageously resulting in an increase in power consumption.

SUMMARY OF THE INVENTION

The present invention has been achieved to solve the problems mentioned above. It is therefore an object of the present invention to reduce power consumption of a semiconductor memory device in which it is necessary to change a part of circuit blocks into an active state in a period in which no read or write operation is carried out.

The above and other objects of the present invention can be accomplished by a semiconductor memory device comprising:

a memory cell array;

an address control circuit block performing an access control to the memory cell array;

a data I/O circuit block transmitting and receiving data to and from the memory cell array;

a mode register to which a mode signal is set; and a main control circuit changing at least one of the address control circuit block and the data I/O circuit block from a standby state into an active state in response to a setting of a predetermined mode signal to the mode register.

In the present invention, the "active state" means a state in which power is correctly supplied to gate circuits constituting each of the circuit blocks, thereby enabling switching operation. That is, the "active state" means a state in which the pseudo power supply wiring is shorted to the main power supply wiring if a power supply wiring is hierarchized. On the other hand, the "standby state" means a state in which supply of power to at least a part of gate circuits constituting each of the circuit blocks is cut off or reduced. Namely, the "standby state" means a state in which the pseudo power supply wiring is disconnected from the main power supply wiring if the power supply wiring is hierarchized.

According to the present invention, even if it is necessary to turn the address control circuit block or the data I/O circuit block into the active state by an operation other than the read or write operation such as an instance of using the ODT or making OCD-impedance adjustment, there is no need to always set these circuit blocks into the active states. The power consumption of the overall semiconductor memory device can be thereby reduced.

BRIEF DESCRIPTION OF THE DRAWINGS

The above and other objects/features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
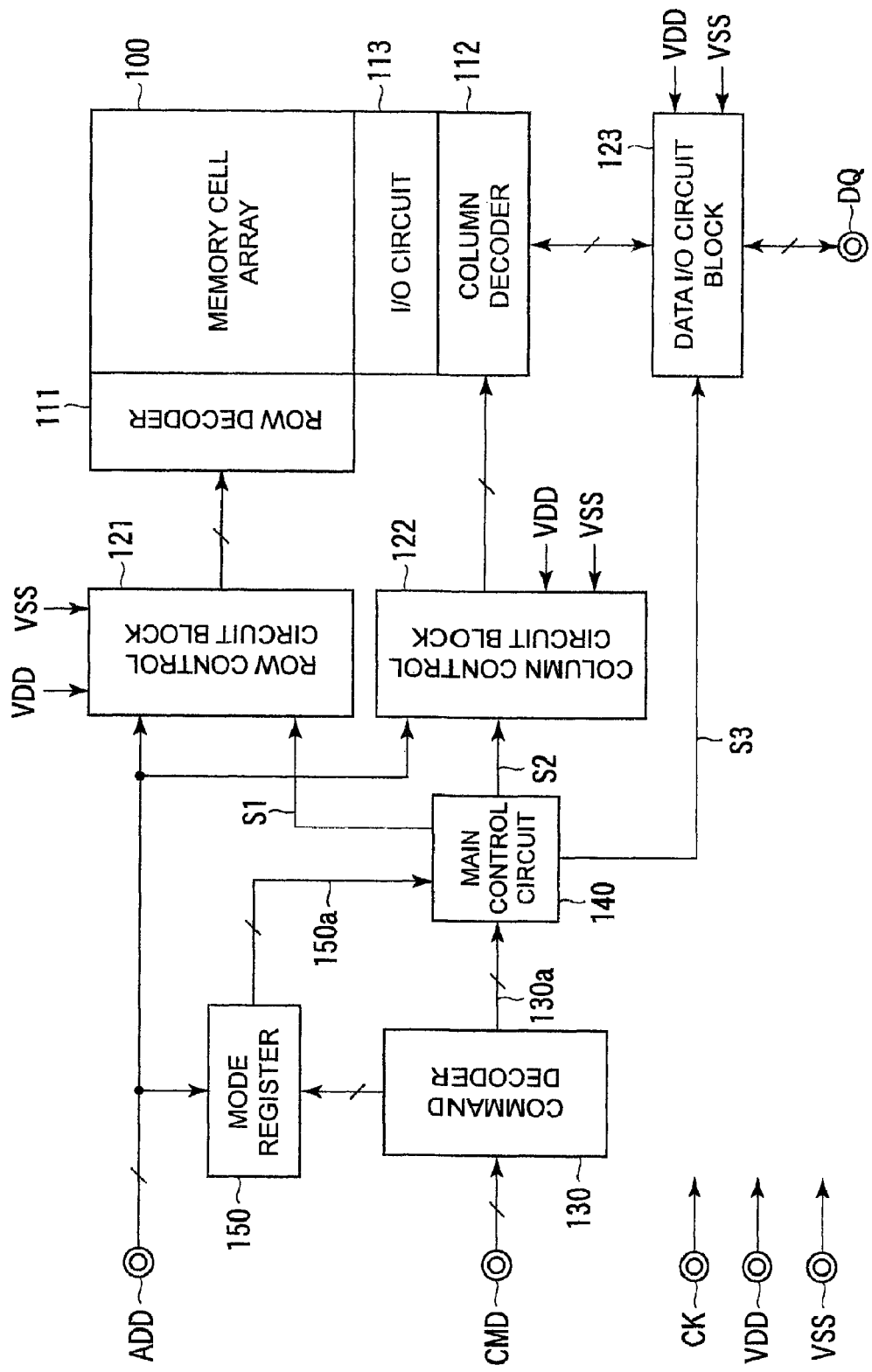
FIG. 1 is a block diagram schematically showing a configuration of a semiconductor memory device according to a preferred embodiment of the present invention.

FIG. 1 is a block diagram schematically showing a configuration of a semiconductor memory device according to a preferred embodiment of the present invention.

As shown in FIG. 1, the semiconductor memory device according to the present embodiment includes a memory cell array 100, a row control circuit block 121 and a column control circuit block 122 that perform access control over the memory cell array 100, and a data I/O circuit block 123 that transmits and receives data to and from the memory cell array 100.

The row control circuit block 121 and the column control circuit block 122 are so-called address control circuit blocks, and a row address and a column address are supplied to the row control circuit block 121 and the column control circuit block 122 from an address terminal ADD, respectively. The row control circuit block 121 includes a row address buffer, a re-fresh counter and the like and an output of the row control circuit block 121 is supplied to a row decoder 111. Further, the column control circuit block 122 includes a column address buffer, a burst counter and the like, and an output of the column control circuit block 121 is supplied to a column decoder 112. An I/O circuit 113 located between the column decoder 112 and the memory cell array 100 is configured to include a read/write amplifier, a sense amplifier and the like.

Meanwhile, the data I/O circuit block 123 located between the column decoder 112 and a data input/output terminal DQ includes a data control circuit, a data latch circuit and the like.

The semiconductor memory device according to the present embodiment also includes a command decoder 130 receiving a command signal from a command terminal CMD. An output 130a of the command decoder 130 is supplied to a main control circuit 140. The main control circuit 140 supplies standby signals S1 to S3 to the row control circuit block 121, the column control circuit block 122, and the data I/O circuit block 123 based on the output 130a, respectively. The standby signals S1 to S3 are similar to the standby signal S0 shown in, FIG. 6, and each of the standby signals S1 to S3 is a signal for turning the corresponding circuit block into either an active state or a standby state.

Needless to say, the output 130a of the command decoder 130 is also supplied to the row control circuit block 121, the column control circuit block 122, and the data I/O circuit block 123. However, wirings for the supply of the output 130a to these blocks are riot shown in FIG. 1, because they are not directly relevant to the concept of the present invention.

As shown in FIG. 1, an output 150a of a mode register 150 is also supplied to the main control circuit 140. The mode register 150 is a circuit to which a mode signal is set if the semiconductor memory device is caused to enter a predetermined operation mode. A content of the mode register 150 is rewritten by supplying a mode signal from the address terminal ADD in a state in which the command decoder 130 allows the content of the mode register 150 to be rewritten. The operations modes that the semiconductor memory device can enter depend on the type of the semiconductor memory device. For example, if the semiconductor memory device is a synchronous DRAM of DDR2 type, operations modes that the synchronous DRAM of DDR2 type can enter include an ODT operation mode, an OCD-impedance adjustment mode, and the like.

Figure 2:
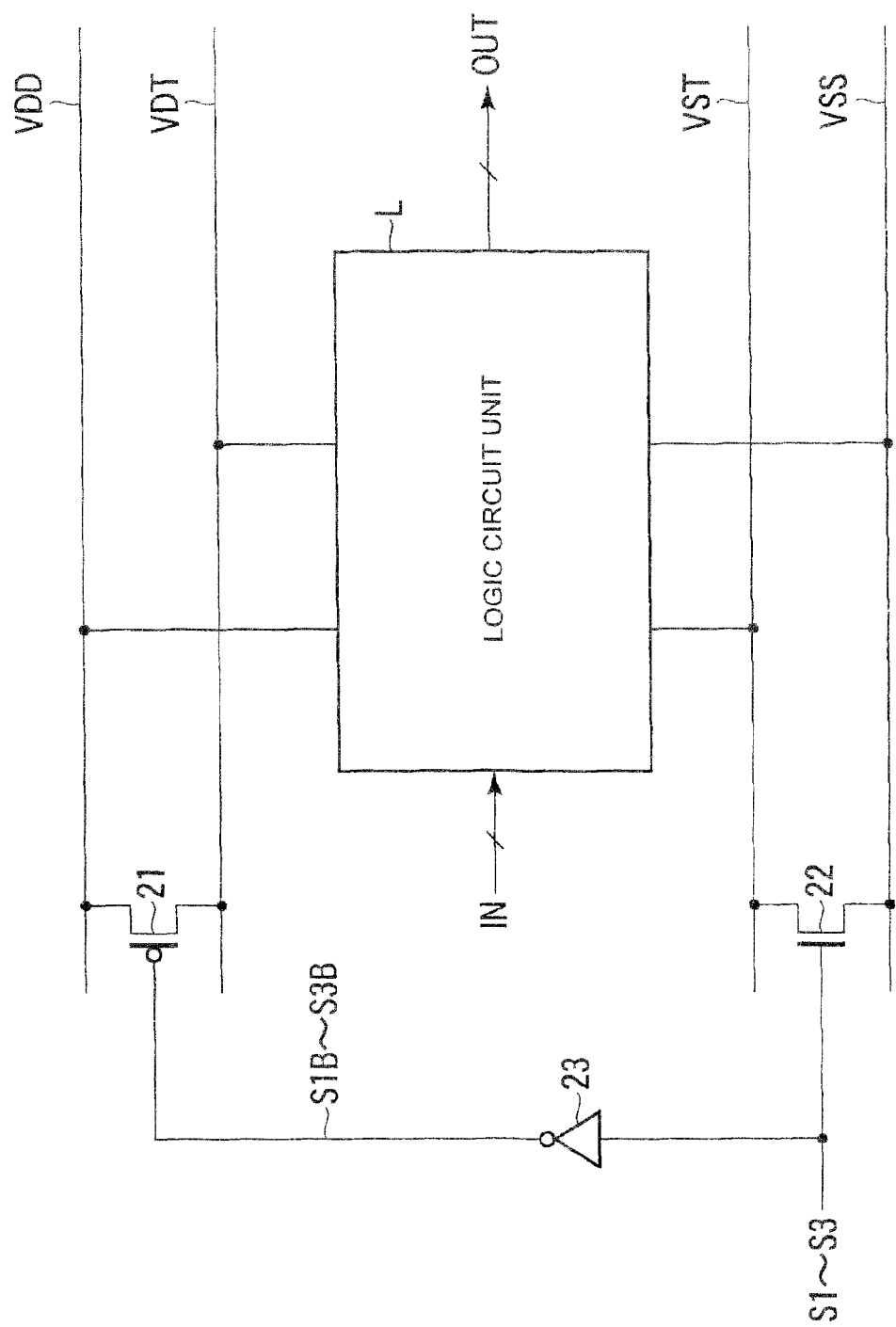
FIG. 2 is a block diagram schematically showing a configuration of each of the row control circuit block, the column control circuit block, and the data I/O circuit block.

FIG. 2 is a block diagram schematically showing a configuration of each of the row control circuit block 121 the column control circuit block 122, and the data I/O circuit block 123.

Figure 6:
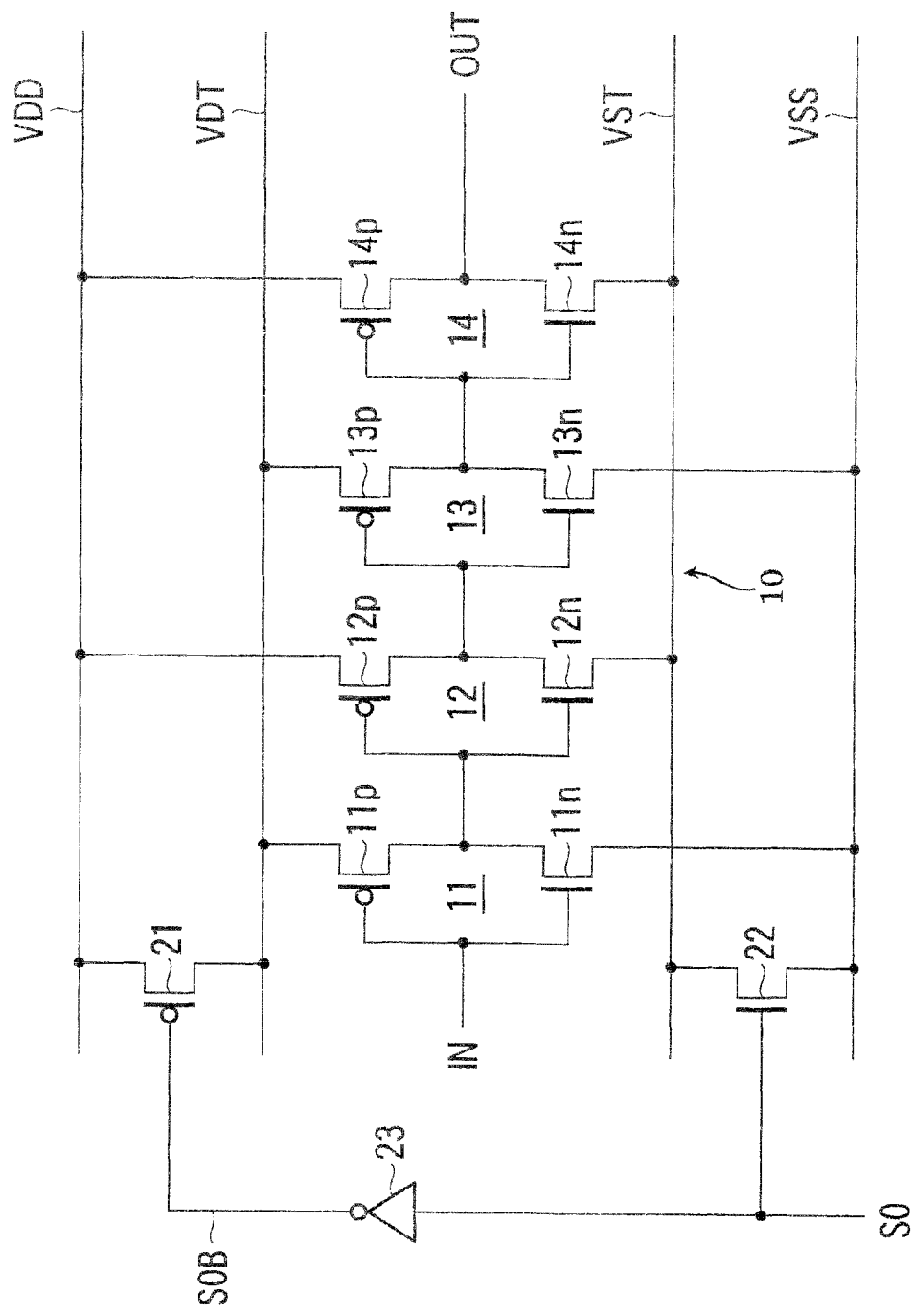
FIG. 6 is a circuit diagram of a conventional semiconductor memory device using pseudo power supply wirings and FIG. 7 is a block diagram showing a data processing system using the semiconductor memory device.

As shown in FIG. 2, four power supply wirings are employed for each of the row control circuit block 121, the column control circuit block 122, and the data I/O circuit block 123 similarly to the circuit shown in FIG. 6. Four power supply wirings includes a main power supply wiring VDD and a pseudo power supply wiring VDT to each of which a power supply potential is supplied, and a main power supply wiring VSS and a pseudo power supply wiring VST to each of which a ground potential is supplied. Among these four power supply wirings, at least the pseudo power supply wirings VDT and VST are provided independently of each of the row control circuit block 121, the column control circuit block 122, and the data I/O circuit block 123.

Similarly to the circuit shown in FIG. 6, a P-channel MOS transistor 21 is connected between the main power supply wiring VDD and the pseudo power supply wiring VDT, and one of signals S1B to S3B inverted from the corresponding standby signals S1 to S3 is supplied to a gate of the P-channel MOS transistor 21. Further, an N-channel MOS transistor 22 is connected between the main power supply wiring VSS and the pseudo power supply wiring VST, and one of the corresponding standby signal S1 to S3 is supplied to a gate of the N-channel MOS transistor 22.

By so configuring, if one of the corresponding standby signals S1 to S3 is at high level, power is correctly supplied to a logic circuit unit L that constitutes the circuit block. If one of the corresponding standby signals S1 to S3 is at low level, supply of power to the logic circuit unit L is cut off.

A specific configuration of the logic circuit unit L that constitutes each of the row control circuit block 121, the column control circuit block 122, and the data I/O circuit block 123 is not shown in FIG. 2. As explained with reference to FIG. 6, each of the row control circuit block 121, the column control circuit block 122, and the data I/O circuit block 123 is configured so that each gate circuit is connected between one of the main power supply wirings VDD and VSS and one of the pseudo power supply wirings VDT and VST. By so configuring, a source of a transistor that is turned off in a standby state is disconnected from the main power supply wiring VDD or VST, thus enabling reduction in power consumption.

Operations performed by the main control circuit 140 will next be described.

As explained above, the main control circuit 140 is a circuit that generates the standby signals S1 to S3. Logic values of the standby signals S1 to S3 are controlled based not only on the output 130a of the command decoder 130, but also on the output 150a of the mode register 150. More specifically, the standby signal S1 is set to high level in response to a row-related command issued at the start of a read or write operation, e.g., an active command (ACT), and set to low level in response to a row-related command issued at the end of the read or write operation, e.g., a precharge command (PRE).

The standby signals S2 and S3 are set to high level in response to a column-related command issued at the start of the read or write operation, e.g., a read command (READ), and set to low level in response to completion of output of data in burst in the read operation.

Using these standby signals S1 to S3, only the necessary circuit block or blocks can be activated only for a necessary period if the read or write operation is to be performed.

Moreover, it the semiconductor memory device according to the present embodiment, even if a mode signal indicating the ODT operation mode or the OCD-impedance setting mode (hereinafter, "ODT operation mode signal" or "OCD-impedance setting mode signal", respectively) is set to the mode register 150, the main control circuit 140 changes the standby signal S3 to high level. To use the ODT or to change an OCD impedance while the semiconductor memory device enters the ODT operation mode or the OCD-impedance setting mode, it is necessary to turn the data I/O circuit block 123 into the active state whether the read or write operation is performed.

Considering these respects, according to the present embodiment, the standby signal S3 is changed to the high level in response to a setting of one of these mode signal to the mode register 150. The standby signal S3 set to high level is kept to be high level until the mode signal is deleted from the mode register 150, and returned to low level when the mode signal is deleted from the mode register 150.

Figure 3:
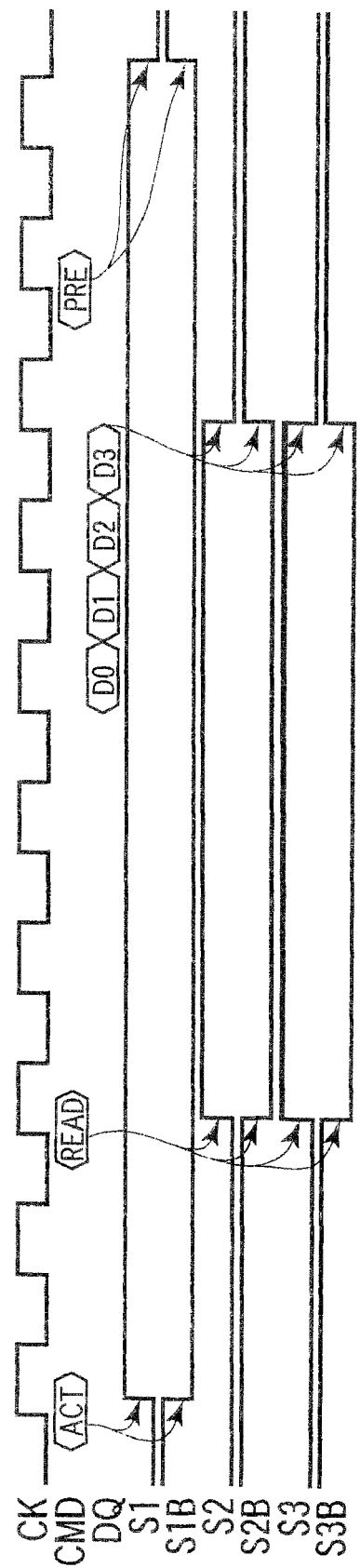
FIG. 3 is a signal waveform showing a read operation performed by the semiconductor memory device according to the preferred embodiment of the present invention.

FIG. 3 is a signal waveform showing a read operation performed by the semiconductor memory device according to the present embodiment.

As shown in FIG. 3, in a period before a read operation, the standby signals S1 to S3 are all kept to low level. By doing so, the transistors 21 and 22 included in each of the row control circuit block 121, the column control circuit block 122, and the data I/O circuit block 123 are all kept in off state. Accordingly, the pseudo power supply wirings VDT and VST are disconnected from the main power supply wirings VDD and VSS, respectively. Due to this, the row control circuit block 121, the column control circuit block 122, and the data I/O circuit block 123 hardly consume power.

Moreover, when the active command (ACT) and the read command (READ) are issued synchronously with a clock signal CK in this order, the semiconductor memory device starts the read operation. As explained above, the active command (ACT) is the row-related command and the read command (READ) is the column-related command.

As shown in FIG. 3, when the active command (ACT) is issued, the standby signal Si is changed to high level. When the read command (READ) is issued, the standby signals S2 and S3 are changed to high level. In response to the change of the standby signals S1 to S3, the pseudo power supply wirings VDT and VST are connected to the main power supply wirings VDD and VSS, respectively. Accordingly, the circuit blocks 121 to 123 are changed from the standby state into the active state and perform necessary operations.

When a burst data output is completed, the standby signals S2 and S3 are changed to low level so as to bring the column control circuit block 122 and the data I/O circuit bock 123 again into the standby state. Thereafter, when the precharge command (PRE) is issued, the standby signal S1 is changed to low level so as to bring the row control circuit block 121. into the standby state accordingly.

It is the main control circuit 140 that performs such control as already explained, and each of the circuit blocks 121 to 123 is turned into the active state for the necessary period under control of the main control circuit 140.

Figure 4:
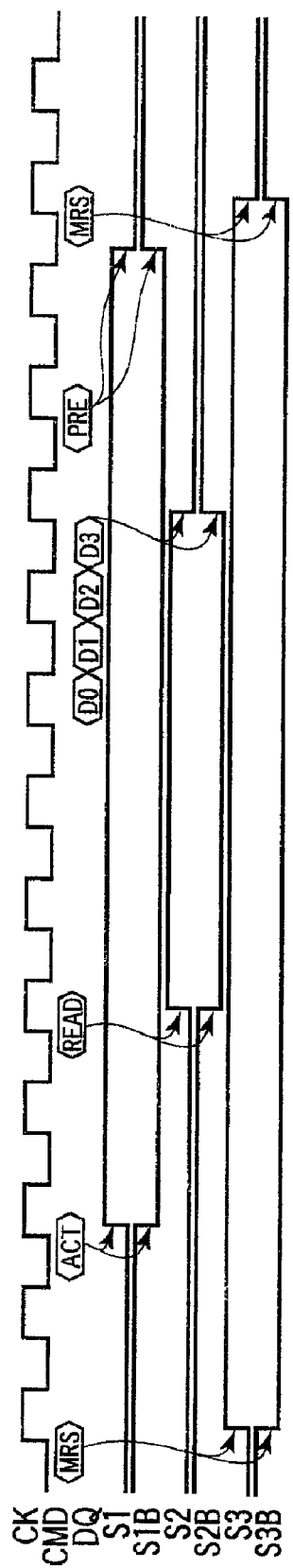
FIG. 4 is a signal waveform showing an ODT operation performed by the semiconductor memory device according to the preferred embodiment of the present invention.

FIG. 4 is another signal waveform showing an operation performed by the semiconductor memory device according to the present embodiment. FIG. 4 shows the operation when the semiconductor memory device enters the ODT operation.

As shown in FIG. 4, in a period before entry to the ODT operation mode, the standby signals S1 to S3 are all kept to low level. When the ODT operation mode signal is set to the mode register 150 synchronously with the clock signal CK, the standby signal S3 is changed to high level to change the data I/O circuit block 123 from the standby state into the active state. At this moment, the standby signals S1 and S2 are kept to low level, so that the row control circuit block 121 and the column control circuit block 122 are kept in the standby state.

Thereafter, when the content of the mode register 150 is rewritten and the ODT operation mode is thereby finished, the standby signal S3 is changed to low level so as to bring the data I/O circuit block 123 again into the standby state. In this manner, while the semiconductor memory device enters the ODT operation mode, the standby signal S3 is always kept to high level whether the read or write operation is performed. It is, therefore, possible to execute an ODT operation at desired time.

Moreover, FIG. 4 shows an example in which the semiconductor memory device performs the read operation in the period in which the semiconductor memory device enters the ODT operation mode. In this case, similarly to the operation shown in FIG. 3, the standby signals S1 and S2 are changed to high level in this order in response to the active command (ACT) and the read command (READ), and the standby signals S2 and S1 are changed to low level in this order in response to completion of the burst data output and the precharge command (PRE). Namely, even in the period in which the semiconductor memory device enters the ODT operation mode, the semiconductor memory device can normally perform the read or write operation, and the standby signals S1 and S2 are correctly changed to predetermined logic level in response to the read or write operation.

Figure 5:
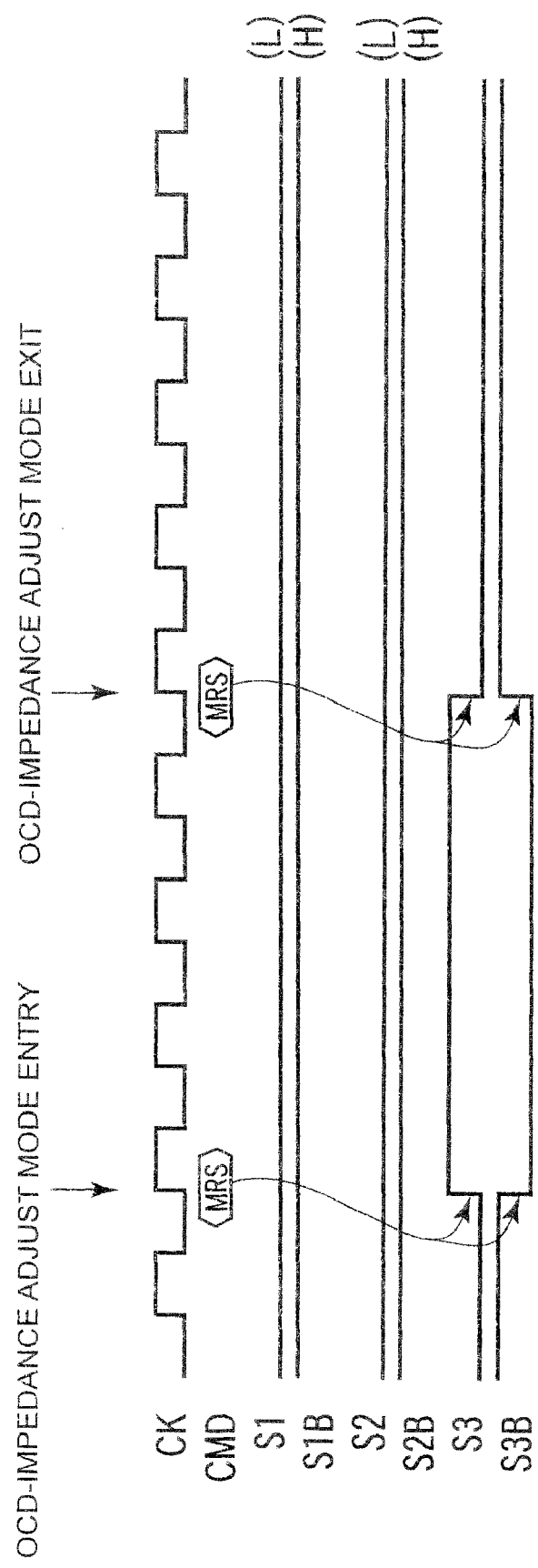
FIG. 5 is a signal waveform showing an OCD-impedance adjustment operation performed by the semiconductor memory device according to the preferred embodiment of the present invention.

FIG. 5 is still another signal waveform showing an operation performed by the semiconductor memory device according to the present embodiment. FIG. 5 shows the operation if the semiconductor memory device enters the OCD-impedance adjustment mode.

As shown in FIG. 5, in a period before entry to the OCD-impedance adjustment mode, the standby signals S1 to S3 are all kept to low level. When the OCD-impedance adjustment mode signal is set to the mode register 150 synchronously with the clock signal CLK, the standby signal S3 is changed to high level to change the data I/O circuit block 123 from the standby state into the active state. At this moment, the standby signals S1 and S2 are kept to low level, so that the row control circuit block 121 and the column control circuit block 122 are kept in the standby state.

Thereafter, when the content of the mode register 150 is rewritten and the OCD-impedance adjustment mode is thereby finished, the standby signal S3 is changed to low level to change the data I/O circuit block 123 again into the standby state. In this manner, even in the period in which the semiconductor memory device enters the OCD-impedance adjustment mode, the standby signal S3 is always kept to high level whether the read or write operation is performed. It is thereby possible to execute an OCD-impedance adjustment operation at desired time.

As described above, according to the present embodiment of the present invention, the data I/O circuit block 123 can be changed from the standby state into the active state in response to the setting of the mode signal indicating the ODT operation mode or the OCD-impedance adjustment mode to the mode register 150. Therefore, there is no need to always set the data I/O circuit block 123 into the active state. The power consumption of the overall semiconductor memory device can be thereby reduced.

Figure 7:
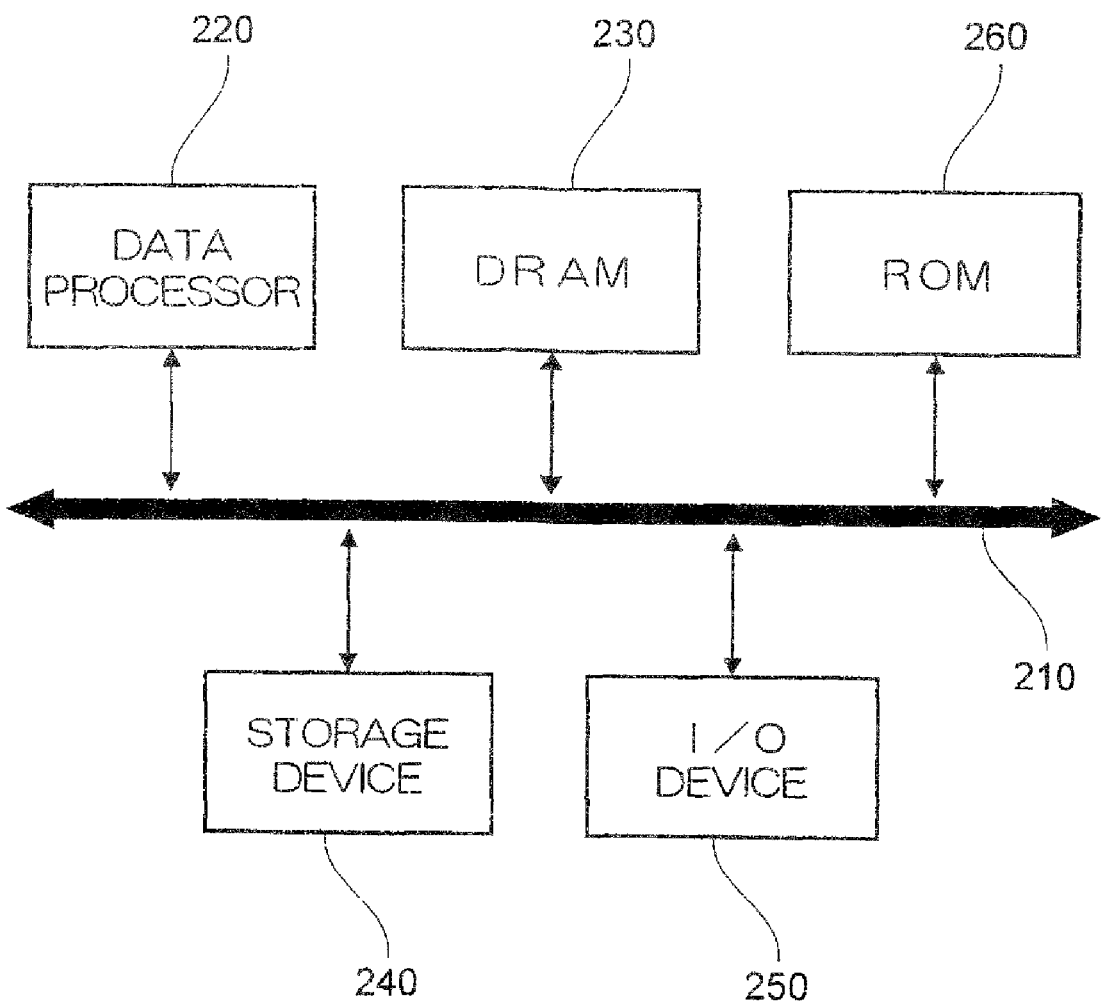

FIG. 7 is a block diagram showing a data processing system using the semiconductor memory device according to the present embodiment. FIG. 7 shows the data processing system 200 in the case where the semiconductor memory device according to the present embodiment is DRAM.

The data processing system 200 shown in FIG. 7 includes a data processor 220 and a DRAM 230 of the present embodiment are connected to each other via a system bus 210. The data processor 220 can be selected from at least a microprocessor (MPU) and a digital signal processor (DSP). In FIG. 7, although the data processor 220 and the DRAM 230 are connected via the system bus 210 in order to simplify the diagram, they can be connected via not the system bus 210 but a local bus.

Further, in FIG. 7, although only one set of system bus 210 is employed in the data processing system 200 in order to simplify the diagram, a serial bus or a parallel bus connected to the system bus 210 via connectors can be provided. As shown in FIG. 7, a storage device 240, an I/O device 250, and a ROM 260 are connected to the system bus 210. However, they are not essential element for the data processing system 200.

The storage device 240 can be selected from at least a hard disk drive, an optical disk drive, and flash memory device. The I/O device 250 can be selected from a display device such as a liquid crystal display (LCD) and an input device such as a key board or a mouse. The I/O device can include either input or output device. Further, although each one element is provided as shown in FIG. 7, two or more same elements can be provided in the data processing system.

The present invention is in no way limited to the aforementioned embodiments, but rather various modifications are possible within the scope of the invention as recited in the claims, and naturally these modifications are included within the scope of the invention.

For example, as explained in the present embodiment, the data I/O circuit block 123 is changed from the standby state into the active state in response to the setting of the ODT operation mode signal or the OCD-impedance adjustment mode signal to the mode register 150. However, conditions for changing the data I/O circuit block 123 into the active state are not limited to those described in the embodiment. Alternatively, the data I/O circuit block 123 can be changed into the active state if a mode signal other than the ODT operation mode signal or the OCD-impedance adjustment mode signal is set to the mode register 150.

Moreover, the circuit block changed into the active state based on the content set to the mode register 150 is not limited to the data I/O circuit block 123. Alternatively one of or both of the row control circuit block 121 and the column control circuit block 122 can be changed into the active state based on the content set to the mode register 150.

According to the present invention, even if it is necessary to turn the address control circuit block or the data I/O circuit block into the active state by an operation other than the read or write operation such as an instance of using the ODT or making OCD-impedance adjustment, there is no need to always set these circuit blocks into the active states. The power consumption of the overall semiconductor memory device can be thereby reduced.

What is claimed is:

1. A method for a semiconductor memory device which comprises a memory cell array, an address control circuit block configured to perform an access control to the memory cell array, a data I/O circuit block configured to transmit and receive data to and from the memory cell array, and a mode register, the method comprising:
   setting first mode information into the mode register;
   deactivating each of the address control circuit block and the data I/O circuit block in response to the first mode information;
   changing a content of the mode register from the first mode information to second mode information; and
   activating one of the address control circuit block and the data I/O circuit block while keeping the other of the address control circuit block and the data I/O circuit block deactivated in response to the second mode information.

2. The method as claimed in claim 1, wherein in response to the second mode information, the data I/O circuit block is activated while the address control circuit block is kept deactivated.

3. The method as claimed in claim 1, wherein the semiconductor memory device further comprises a main power supply wiring configured to supply a power voltage, a first pseudo power supply wiring configured to correspond to the address control circuit block and a second pseudo power supply wiring configured to correspond to the data I/O circuit block, and the deactivating each of the address control circuit block and the data I/O circuit block includes disconnecting each of the first and second pseudo power supply wiring from the main power supply wiring and the activating the one of the address control circuit block and the data I/O circuit block includes connecting a corresponding one of the first and second pseudo power supply wiring to the main power supply wiring.

4. The method as claimed in claim 3, further comprising performing an ODT operation in response to the second mode information.

5. The method as claimed in claim 3, further comprising performing an OCD-impedance adjacent operation in response to the second mode information.

6. The method as claimed in claim 2, wherein the semiconductor memory device further comprises a main power supply wiring configured to supply a power voltage, a first pseudo power supply wiring configured to correspond to the address control circuit block and a second pseudo power supply wiring configured to correspond to the data I/O circuit block, and the deactivating each of the address control circuit block and the data I/O circuit block includes disconnecting each of the first and second pseudo power supply wiring from the main power supply wiring and the activating data I/O circuit block includes connecting the second pseudo power supply wiring to the main power supply wiring.

7. The method as claimed in claim 6, further comprising performing an ODT operation in response to the second mode information.

8. The method as claimed in claim 6, further comprising performing an OCD-impedance adjacent operation in response to the second mode information.

* * * * *